(12) United States Patent
Yako et al.

(10) Patent No.: US 10,867,680 B2
(45) Date of Patent: Dec. 15, 2020

(54) DATA ERASURE DEVICE FOR ERASING DATA FROM NON-VOLATILE SEMICONDUCTOR MEMORY DEVICE AND METHOD FOR MANUFACTURING NON-VOLATILE SEMICONDUCTOR MEMORY DEVICE

(71) Applicant: DENSO CORPORATION, Kariya (JP)

(72) Inventors: Koichi Yako, Kariya (JP); Yoshiaki Nakayama, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/502,924

(22) Filed: Jul. 3, 2019

(65) Prior Publication Data

US 2019/0325967 A1    Oct. 24, 2019

Related U.S. Application Data

(63) Continuation of application No. PCT/JP2018/001431, filed on Jan. 18, 2018.

(30) Foreign Application Priority Data

Feb. 15, 2017 (JP) ................. 2017-026225

(51) Int. Cl.
*G11C 16/14* (2006.01)
*G11C 16/16* (2006.01)
*G11C 16/34* (2006.01)
*H01L 27/11521* (2017.01)

(52) U.S. Cl.
CPC .............. *G11C 16/14* (2013.01); *G11C 16/16* (2013.01); *G11C 16/344* (2013.01); *G11C 16/3445* (2013.01); *H01L 27/11521* (2013.01)

(58) Field of Classification Search
CPC ....... G11C 16/14; G11C 16/16; G11C 16/344; G11C 16/3445
USPC .................................................. 365/185.29
See application file for complete search history.

(56) References Cited

U.S. PATENT DOCUMENTS

| 5,615,154 | A | 3/1997 | Yamada | |
|---|---|---|---|---|
| 7,907,449 | B2 * | 3/2011 | Lee | G11C 16/16 365/185.11 |
| 8,023,330 | B2 * | 9/2011 | Kim | G11C 16/344 365/185.18 |
| 8,194,467 | B2 * | 6/2012 | Mikajiri | G11C 5/02 365/185.29 |
| 9,224,494 | B2 * | 12/2015 | Chin | G11C 16/3454 |
| 10,074,440 | B2 * | 9/2018 | Ray | G11C 16/3495 |

(Continued)

*Primary Examiner* — Son L Mai
(74) *Attorney, Agent, or Firm* — Posz Law Group, PLC

(57) ABSTRACT

A data erasure device is for a non-volatile semiconductor memory device, which includes cells in which data is written by an application of a first voltage and erased by an application of a second voltage differing from the first voltage. The data erasure device includes a controller. The controller applies a second voltage to the cells over first time period with multiple occurrences to set the cells into a first erasure state, and applies the second voltage to the cells over second time period, which is longer than the first time period, to set the cells in a second erasure state deeper than the first erasure state. The controller changes a number of occurrences of applying the second voltage over the first time period to each of the cells or each of multiple cell groups having the cells according to respective erasure states of the cells.

28 Claims, 5 Drawing Sheets

(56) References Cited

U.S. PATENT DOCUMENTS

2002/0018370 A1    2/2002   Hirano
2002/0080653 A1    6/2002   Lee et al.
2004/0076038 A1    4/2004   Ohtani et al.
2004/0125656 A1    7/2004   Mizoguchi et al.

* cited by examiner

DATA ERASURE DEVICE FOR ERASING DATA FROM NON-VOLATILE SEMICONDUCTOR MEMORY DEVICE AND METHOD FOR MANUFACTURING NON-VOLATILE SEMICONDUCTOR MEMORY DEVICE

CROSS REFERENCE TO RELATED APPLICATION

The present application is a continuation application of International Patent Application No. PCT/JP2018/001431 filed on Jan. 18, 2018, which designated the U.S. and claims the benefit of priority from Japanese Patent Application No. 2017-026225 filed on Feb. 15, 2017. The entire disclosures of all of the above applications are incorporated herein by reference.

TECHNICAL FIELD

The present disclosure relates to a data erasure device and a manufacturing method for a non-volatile semiconductor memory device.

BACKGROUND

A non-volatile semiconductor memory device includes multiple cells for storing data through an accumulation of charges at a floating gate. A threshold voltage or a current flowing through the cell may be measured to read out data stored in this type of non-volatile semiconductor memory device. A value of the current flowing through the cell may be changed by the amount of charges accumulated at the floating gate. The data may be read out through a change in the value of the current. For example, whether the data is present may be determined by, for example, whether a cell current value is less than or equal to a predetermined threshold value.

SUMMARY

The present disclosure describes a data erasure device for erasing data from a non-volatile semiconductor memory device and a manufacturing method for manufacturing the non-volatile semiconductor memory device having multiple cells in which data may be written or erased.

BRIEF DESCRIPTION OF DRAWINGS

The above and other objects, features and advantages of the present disclosure will become more apparent from the following detailed description made with reference to the accompanying drawings. In the drawings.

DETAILED DESCRIPTION

Figure 1:
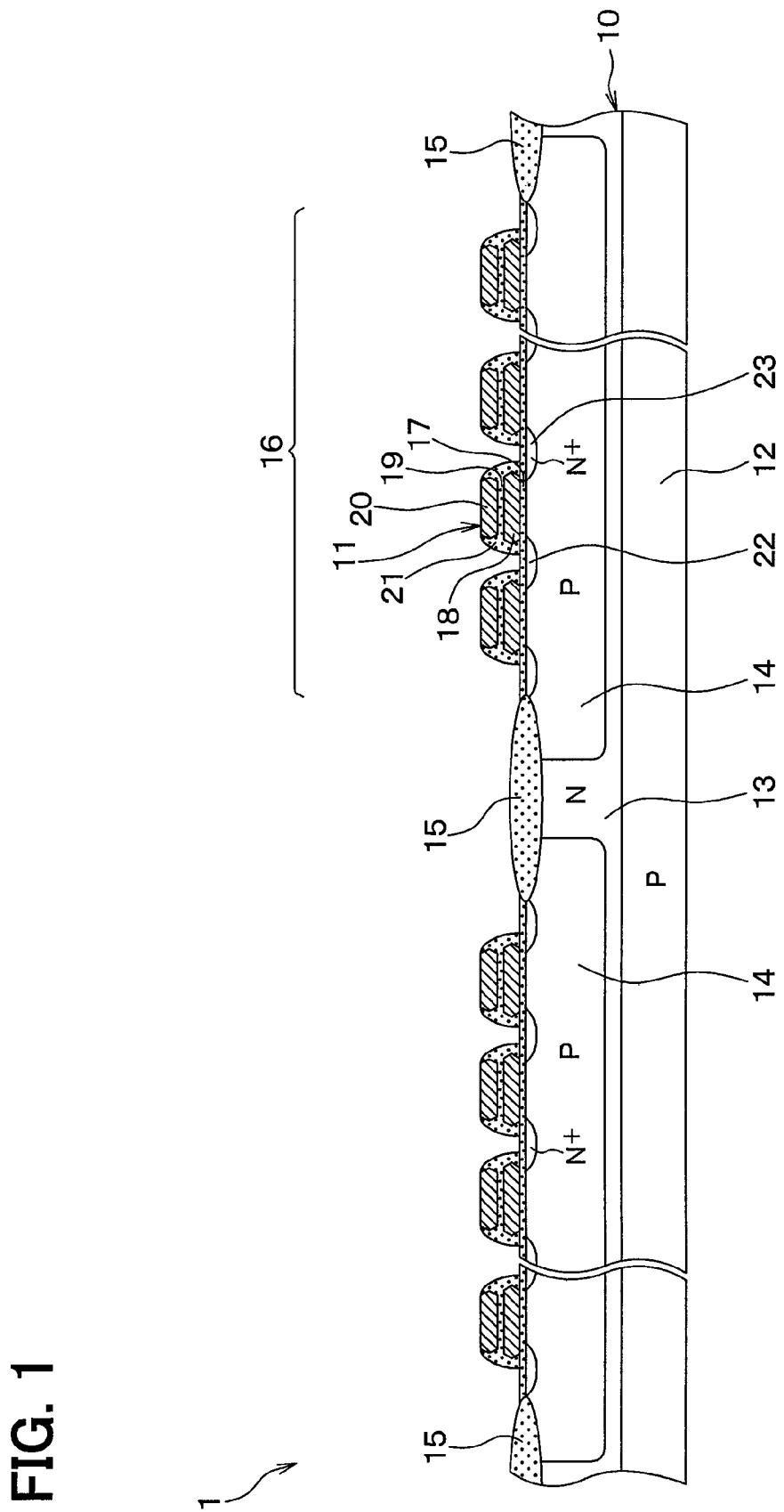
FIG. 1 is a cross-sectional view of a non-volatile semiconductor memory device according to a first embodiment.

Measuring a current flowing through a cell in a non-volatile semiconductor memory device may have advantages in faster data readout. However, in a situation of the cell having a cell current value being closer to a predetermined threshold value, a retention fault in which the cell current value exceeds the predetermined threshold value may easily occur as charges accumulated at a floating gate moves out of the floating gate over time. Although a deep erasure may be applied for preventing the above situation, a data write time increases. Additionally, it may be difficult to know the depth of an erasure state from the current cell value, because the cell current value is closer to a value of zero in both of a shallow erasure state and a deep erasure state.

For maintaining stability of erasure depth while shortening the write time, the following two steps may be applied to perform an erasure process. For example, in a first step, a stepping voltage is applied to perform the erasure process up to a first predetermined value. In a second step, a bulk voltage is applied to perform the erasure process up to a second predetermined value. Thus, over-erasure may be inhibited.

However, it may be required to provide a circuit for applying a stepping voltage. Hence, the configuration of the erasure device may become complex. Additionally, in a situation where the erasure device is used in checking of retention characteristics or the like in a manufacturing method of the non-volatile semiconductor memory device, the configuration of a manufacturing apparatus may become complex.

In some of the embodiments of the present disclosure, a data erasure device for erasing data from a non-volatile semiconductor memory device with a simpler configuration and a method for manufacturing the non-volatile semiconductor memory device with the simpler configuration are provided.

According to a first aspect of the present disclosure, a data erasure device is provided for erasing data from a non-volatile semiconductor memory device including cells in which data is written by an application of a first voltage and the data is written by an application of a second voltage differing from the first voltage. The data erasure device includes a controller configured to apply a voltage to the cell. The controller sets a magnitude of the second voltage to be constant. The controller applies the second voltage to the cells over first time period with multiple occurrences to set the cells into a first erasure state. Subsequent to the controller setting the cells into the first erasure state, the controller applies the second voltage to the cells over second time period to set the cells into a second erasure state. The second time period is longer than the first time period, and the second erasure state is deeper than the first erasure state. In response to the controller setting the cells into the first erasure state, the controller changes a number of occurrences of applying the second voltage over the first time period to each of the cells or each of cell groups having the cells according to respective erasure states of the cells.

The easiness level of data erasure varies in each of the cells. When the second voltage is applied to the cell whose data is easily erased over a longer time, the data can be deeply erased. In contrast, the second voltage may be applied to the cells over the first time period with multiple occurrences, and a number of occurrences of applying the second voltage to each cell or each cell group may be changed according to respective erasure states of the cells. Thus, it is possible to inhibit the cell, whose data is easily erased, from reaching a deeper erasure state. Accordingly, the magnitude of the second voltage, the length of the first time period, and the number of occurrences of applying the second voltage are properly set to align respective erasure depths of the cells for setting the cells into the first erasure state, which is a shallow erasure state.

Subsequently, the second voltage is applied to the cells over the second time period, which is longer than the first time period, to perform strong erasure for setting the cells in a second erasure state, which is an erasure state where the cells are stable. At this moment, when the time length of the second time period is properly set, it is possible to inhibit the cells from reaching a deeper erasure state and lengthening the write time. In this kind of method, it is possible to maintain the stability of erasure depth while shortening the write time with setting the magnitude of the second voltage to be constant. Thus, it is possible to simplify the configuration of the erasure device.

According to a second aspect of the present disclosure, a method for manufacturing a non-volatile semiconductor memory device having cells in which data is written by an application of a first voltage and is erased by an application of a second voltage is provided. The method includes checking of the cells. The checking of the cells includes: setting of a magnitude of the second voltage to be constant; applying of the second voltage to the cells over first time period with multiple occurrences to set the cells in a first erasure state; and applying of the second voltage to the cells over second time period to set the cells in a second erasure state, subsequent to setting the cells into the first erasure state. The second time period is longer than the first time period, and the second erasure state is deeper than the first erasure state. Additionally, the setting of the cells into the first erasure state includes changing of a number of occurrences of applying the second voltage over the first time period to each of the cells or each of cell groups having the cells according to respective erasure states of the cells.

Therefore, the second voltage may be applied to the cells over the first time period with multiple occurrences, and a number of occurrences of applying the second voltage to each cell or each cell group may be changed according to respective erasure states of the cells. Thus, it is possible to inhibit the cell, whose data is easily erased, from reaching a deeper erasure state. Accordingly, the magnitude of the second voltage, the length of the first time period, and the number of occurrences of applying the second voltage are properly set to align respective erasure depths of the cells for setting the multiple cells into the first erasure state, which is a shallow erasure state.

Subsequently, the second voltage is applied to the cells over the second time period, which is longer than the first time period, to perform a strong erasure for setting the cells into a second erasure state, which is an erasure state where the multiple cells are stable. At this moment, when the time length of second time period is properly set, it is possible to inhibit the cells from reaching a deeper erasure state and lengthening the write time. In this kind of method, it is possible to maintain the stability of erasure depth while shortening the write time with setting the magnitude of the second voltage to be constant. Accordingly, it is possible to simplify the configuration of a manufacturing apparatus, in a situation where the data erasure device is used in checking of retention characteristics or the like in a method for manufacturing the non-volatile semiconductor memory device.

Embodiments of the present disclosure will be described below with reference to the drawings. In the following embodiments, the same reference numerals are assigned to parts that are the same or equivalent to each other for description.

First Embodiment

The following describes a first embodiment. As illustrated in FIG. 1, a non-volatile semiconductor memory device according to the present embodiment has a configuration in which multiple cells 11 are formed on a semiconductor substrate 10. The semiconductor substrate 10 has a configuration in which an N-type well 13 is formed on a P-type silicon substrate 12. Multiple P-type wells 14 are provided to be separated from each other at a surface layer portion of the N-type well 13, and is partitioned by a LOCOS oxide film 15. That is, the P-type wells 14 are separated by the N-type well 13.

Multiple cells 11 are formed on a single P-type well 14. A cell group 16 includes the multiple cells 11 formed on the single P-type well 14. The non-volatile semiconductor memory device 1 includes multiple cell groups 16.

The cell 11 stores digital information of "0" or "1". A single cell 11 corresponds to one bit. Data is written into the cell 11 by an application of a first voltage. The data is erased from the cell 11 by application of a second voltage. The second voltage is different from the first voltage.

A part of the multiple cells 11 is provided for each of the multiple P-type wells 14. The following describes this particular structure. A two-layer polysilicon gate electrode structure and a side wall 21 are formed on a surface of the semiconductor substrate 10. In the two-layer polysilicon gate electrode structure, a gate insulating film 17, a floating gate 18, an interlayer insulating film 19, and a control gate 20 are stacked in order. On the other hand, an $N^+$-type source region 22 and an $N^+$-type drain region 23 are respectively formed at both sides of the two-layer polysilicon electrode structure on a surface layer of the semiconductor substrate 10. In the present embodiment, the cells 11 are arranged such that two adjacent cells 11 share the source region 22 or the drain region 23.

Figure 2:
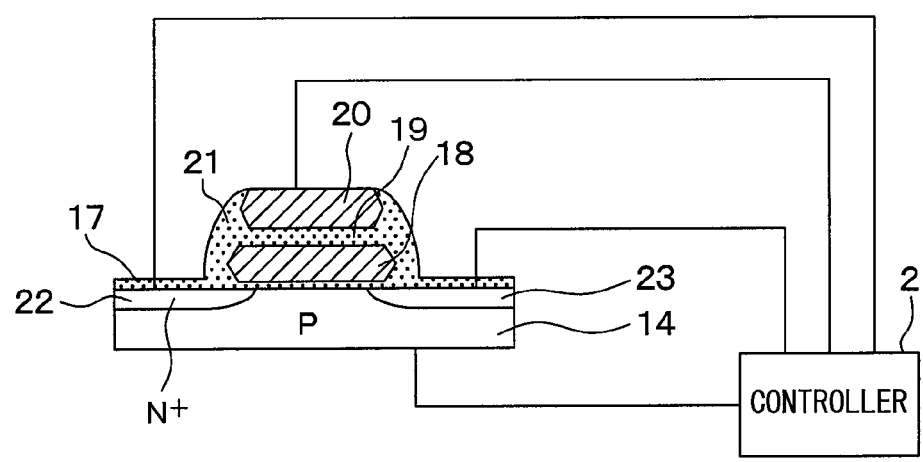
FIG. 2 is a partial enlarged view of FIG. 1.

As illustrated in FIG. 2, the P-type well 14, the control gate 20, the source region 22 and the drain region 23 are connected to a controller 2. The controller 2 is a part of an erasure device to erase data from the non-volatile semiconductor memory device 1. The controller 2 includes a microcomputer having a memory (such as ROM or RAM) and a peripheral circuit. For writing data, erasing data and reading out data, a voltage is applied from the controller 2 to the P-type well 14 or the like.

Figure 3:
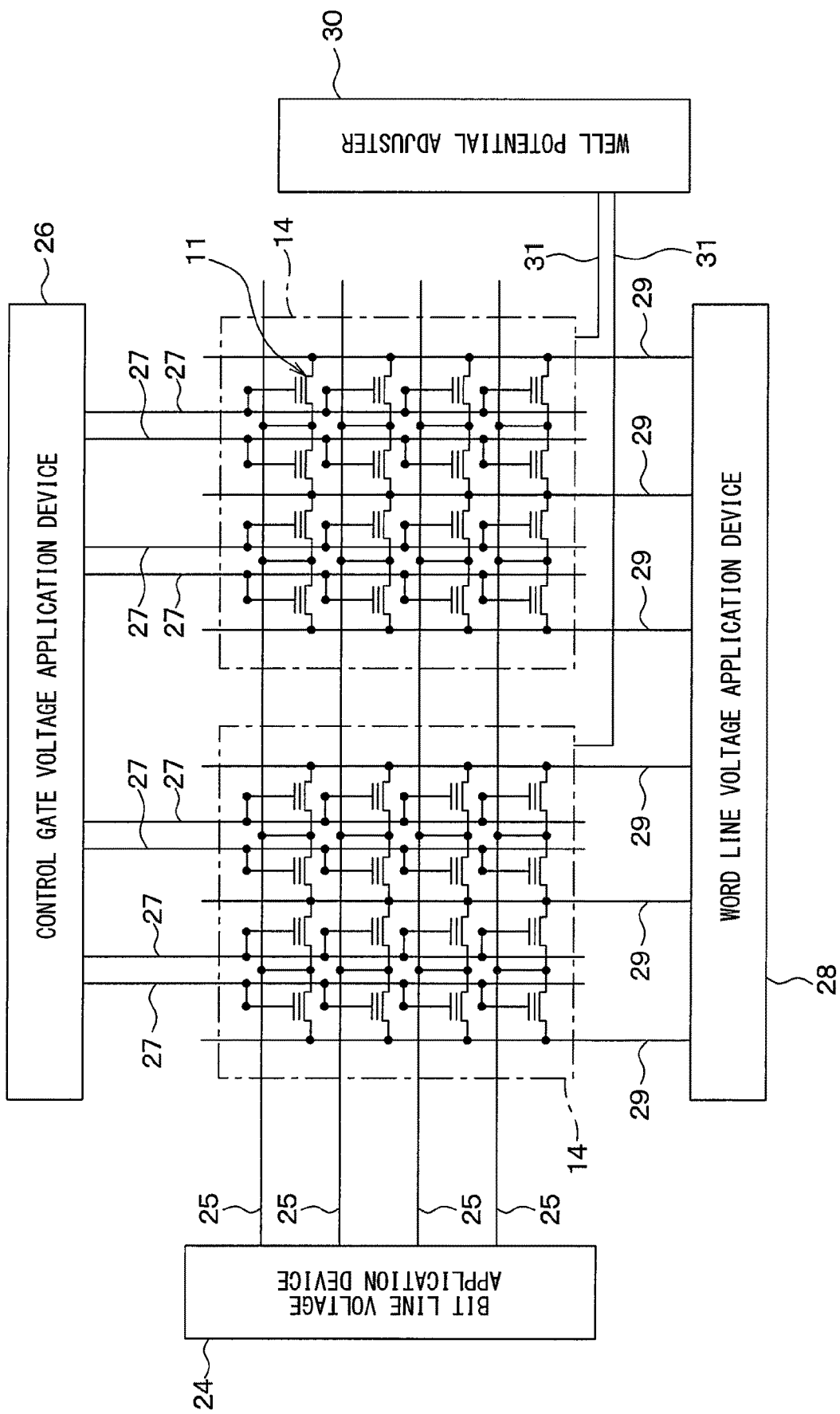
FIG. 3 is a configuration diagram of the non-volatile semiconductor memory device according to the first embodiment.

In particular, the P-type well 14 or the like is connected to the controller 2 through a bit line voltage application device 24, a bit line 25, a control gate voltage application device 26, a control gate line 27, a word line voltage application device 28, a word line 29, a well potential adjuster 30 and a well line 31, which are illustrated in FIG. 3. The bit line voltage application device 24, the control gate voltage application device 26, the word line voltage application device 28, and the well potential adjuster 30 are circuits that respectively apply a voltage to the bit line 25, the control gate line 27, the word line 29 and the well line 31, in response to a command from the controller 2.

Multiple bit lines 25 are provided. The drain regions 23, which are respectively provided at the multiple cells 11, are correspondingly connected to the bit lines 25. Multiple control gate lines 27 are provided. The control gates 20, which are respectively provided at the multiple cells 11, are connected to each of the control gate lines 27. Multiple word lines 29 are provided. The source regions 22, which are respectively provided at the multiple cells 11, are correspondingly connected to the word lines 29. Multiple the well lines 31 are provided. The P-type wells 14 are respectively connected to the well lines 31. The data can be written, erased, and read out at the desired cell 11 by applying a proper voltage to the bit lines 25, the control gate lines 27, the word lines 29, and the well lines 31.

The operation of writing, erasing and reading out data in the non-volatile semiconductor memory device 1 is described. The first voltage is applied to the cell 11 when writing data. For example, the control gate 20 is applied with a write voltage of 5V, and the source region 22, the drain region 23 and the P-type well 14 are set to a GND voltage, that is, 0V.

As a result, high energy electrons are generated in a channel region of the surface layer of the semiconductor substrate 10, and the high energy electrons are injected into the floating gate 18. Thus, the high energy electrons are injected into the floating gate 18 to write data.

The second voltage is applied to the cell 11 when erasing data. The second voltage is different from the first voltage. For example, the control gate 20 is applied with a readout voltage of 0V, and the P-type well 14, the source region 22 and the drain region 23 are applied with a voltage of 5V.

As a result, high energy holes are generated in the channel region, and the high energy holes are injected into the floating gate 18. Thus, the floating gate 18, which had been injected with electrons, is set to a neural state to erase data.

A predetermined voltage is applied to the cell 11 when reading out data. For example, a readout voltage of 0V is applied to the control gate 20, a voltage of 5V is applied to the P-type well 14, a voltage of 1V is applied to the drain region 23, and a voltage of 0V is applied to the source region 22. A value of a current flowing between the drain region 23 and the source region 22 provided at the cell 11 is compared with a predetermined threshold value to determine whether the data stored in the cell 11 is "0" or "1".

Thus, the data is written into the cell 11 by applying the first voltage, and the data is erased from the cell 11 by applying the second voltage. However, the easiness of data erasure differs in each of the cells 11. Erasure depth differs in each of the cells 11, as the second voltage with the same magnitude is applied to the cells 11 for the same period of time. Additionally, charges accumulated in the floating gate 18 move out of the floating gate 18 over time, and the erasure state of each cell 11 reaches a shallow level.

Figure 4A:
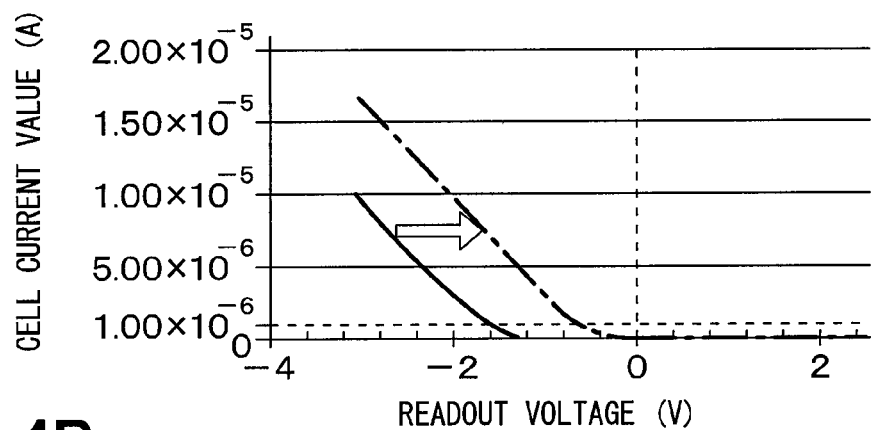
FIG. 4A is a graph that illustrates a relationship between a readout voltage and a cell current value of a cell with an original erasure state in a deep level.
Figure 4B:
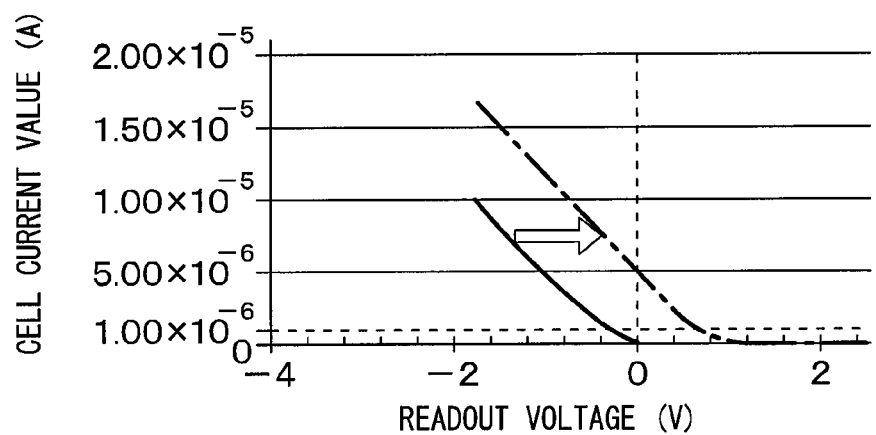
FIG. 4B is a graph that illustrates the relationship between the readout voltage and the cell current value of the cell with the original erasure state in a shallow level.

In the cell 11 having an original erasure state in a deep level, as shown in FIG. 4A, the cell current value becomes equal to or less than a reference value, even though the erasure state reaches the shallow level over a certain amount of time. However, in the cell 11 having an original erasure state in the shallow level, as shown in FIG. 4B, the cell current value becomes more than the reference value after a certain amount of time has been elapsed. In the respective graphs of FIGS. 4A and 4B, a solid line indicates the cell current value at the original erasure state, and a dashed-dotted line indicates the cell current value after a certain amount of time has been elapsed. The erasure state is determined by the cell current value when the control gate 20 is set at 0V. The reference value of the cell current is set to $1.00 \times 10^{-6}$ A.

As described above, in the cell 11 having the original erasure state in the shallow level, the retention fault in which the cell current value exceeds the reference value easily occurs over time. In order to prevent this situation, when performing a deep erasure, it will take longer write time.

Figure 5:
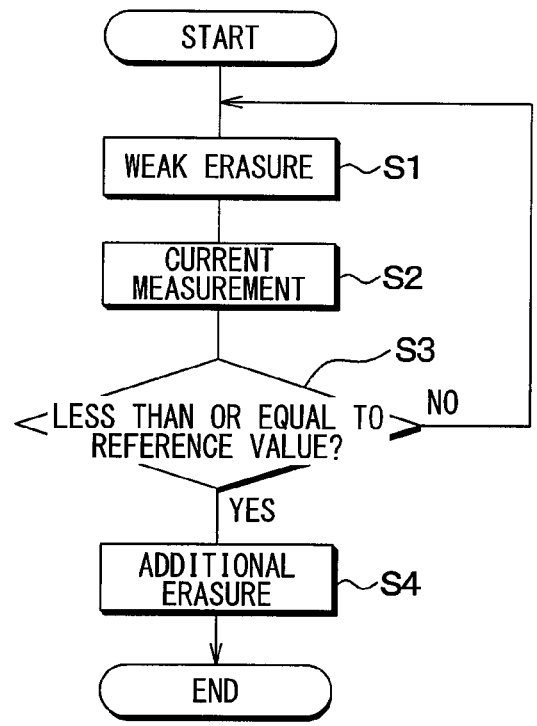
FIG. 5 is a flowchart of a data erasure process according to the first embodiment.

The present embodiment attains stability of erasure depth while shortening the write time with the controller 2 performing processing of steps S1 to S4 illustrated in FIG. 5. A data erasure process illustrated in FIG. 5 is used, for example, to check retention characteristics or the like of the cell 11 before shipment of the non-volatile semiconductor memory device, or to rewrite data after the shipment of the non-volatile semiconductor memory device.

In steps S1 to S3, weak erasure is repeated to set all of the cells 11 in a first erasure state, which is the erasure state in the shallow level. It is noted that the first erasure state herein means that the value of current flowing at a time of applying the predetermined voltage to the cell 11 reaches a value within a predetermined range.

In step S1, the controller 2 performs the weak erasure for the multiple cells 11. In particular, the magnitude of the second voltage is constant. In other words, a voltage applied to the P-type well 14, the control gate 20, the source region 22 and the drain region 23 is constant. The second voltage is applied to the multiple cells 11 during the time t1. For example, the second voltage is applied such that an electric field, which is larger than or equal to 10 MV/cm and smaller than or equal to 15 MV/cm, is generated between the floating gate 18 and the P-type well 14. In the present embodiment, the time t1 is set to be constant.

In step S4, the second voltage is applied to the multiple cells 11 during time t2, which is longer than the time t1. For example, the time t2 may be at least 10 times longer than the time t1 so as to improve the stability of the erasure depth. For example, if the time t1 is 1 millisecond, the time t2 may be longer than or equal to 10 milliseconds. If the time t1 is 5 milliseconds, it may be preferable to set the time t2 to be longer than or equal to 50 milliseconds. In the present embodiment, the time t1 is set to be 1 millisecond or shorter, and the time t2 is set to be 10 milliseconds or longer. The time t1 corresponds to a first time period, and the time t2 corresponds to a second time period.

In the present embodiment, the second voltage is applied to each of the cell groups 16. The time t1 is set such that the data in all of the cells 11 in the single group cell 16 is not erased by applying the second voltage with one occurrence, in consideration of a variation of easiness of data erasure in each of the cells 11. Herein, among the multiple cells 11 included in the single cell group 16, a time t3 is required to apply a second voltage for setting the cells 11, which are written with data through an application of the first voltage, to the first erasure state. The time t1 is set to be shorter than the time t3. As a result, there is at least one cell 11 having a cell current value larger than a predetermined reference value, after the second voltage is applied with one occurrence during the time t1. The time t3 corresponds to a third time period.

After step S1, the controller 2 shifts processing to step S2. After the controller 2 stops applying the second voltage to the cell 11, the controller 2 applies a predetermined readout voltage to the cell 11 to measure the cell current, and then shifts processing to step S3. In step S3, the controller 2 determines whether the cell current value is within a predetermined range. In the present embodiment, the controller 2 determines whether the cell current value is larger than or equal to 0 A and is smaller than or equal to $1.00 \times 10^{-6}$ A, when the readout voltage is 0V.

In step S3, in a situation where the cell current value is within the predetermined range, the controller 2 shifts processing to step S4. In step S3, in a situation where the cell current value is not within the predetermined range, the controller 2 shifts processing to step S1.

In the present embodiment, the determination in step S3 is performed for each of the cell groups 16. That is, the controller 2 repeats processing of step S1 to one of the multiple cell groups 16 until the respective values of cell current of all cells 11 included in the one of cell groups 16 become lower than or equal to the predetermined reference value. Thus, in steps S1 to S3, the number of occurrences of performing step S1 varies in each of the cell groups 16 according to the respective erasure states of the multiple cells 11.

In step S4, the controller 2 performs additional erasure on the multiple cells 11. In particular, the second voltage is applied to the multiple cells 11 during the time t2 to set the multiple cells 11 to the second erasure state. The time t2 is set to be longer than the time t1. The second erasure state is deeper than the first erasure state. In the present embodiment, the second voltage has the same magnitude as in step S1. As mentioned above, the time t2 is set to be 10 milliseconds or longer. The application of the second voltage in step S4 is performed for each of the cell groups 16.

The multiple cells 11 are aligned in the shallow erasure state in steps S1 to S3, and the erasure depth of the cells 11 are deepened in step S4. That is, the cell current value at a time of applying a predetermined voltage to the cell 11 becomes smaller than the cell current value in each of the cells 11 at the first erasure state. As a result, the erasure state is stabilized, and the retention fault is inhibited. The time t2 is properly set to inhibit the multiple cells 11 from reaching a further deeper erasure state, and to inhibit the multiple cells 11 from having a longer data write time.

As described above, step S1 is performed with multiple occurrences, and the number of occurrences of performing step S1 is varied for each of the cell groups 16. Therefore, it is possible to inhibit the cell 11, whose data is easily erased, from reaching a deep erasure state. Subsequently, in step S4, the multiple cells 11 reaches a second erasure state, which is an erasure state having a stable depth.

As described above, in the present embodiment, it is possible to achieve the stability of erasure depth while shortening the write time by setting the magnitude of the second voltage with a constant value. Therefore, it is possible to simplify an erasure device. In a situation where the erasure device is used to check, for example, retention characteristics in a manufacturing process of the non-volatile semiconductor memory device, it is possible to simplify the manufacturing apparatus.

Second Embodiment

The following describes a second embodiment. The second embodiment is different from the first embodiment in the configuration of the data erasure process, and the other parts are similar to the first embodiment, so only the difference from the first embodiment will be described.

Figure 6:
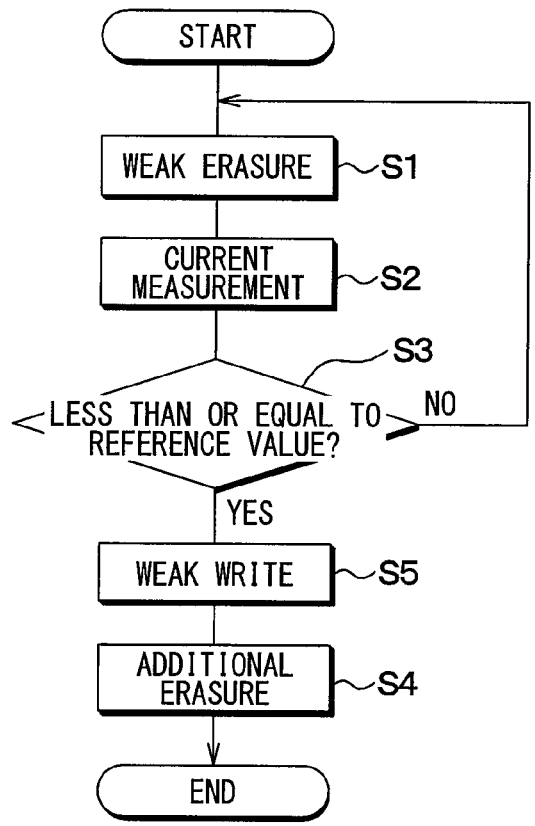
FIG. 6 is a flowchart of a data erasure process according to the second embodiment.

As illustrated in FIG. 6, in the present embodiment, after the cell current value is determined to be smaller than or equal to a predetermined reference value in step S3, step S5 is performed prior to step S4. In step S5, the controller 2 performs a weak write on a part of the cells 11.

In particular, the controller 2 applies the first voltage to the part of the cells 11, which reaches the first erasure state earlier than other parts of the cells 11 among the multiple cells 11. At this moment, the magnitude of the first voltage and the application time of the first voltage are set such that the part of the cells 11 is maintained into the first erasure state.

In the present embodiment, as the number of occurrences of step S1 to be performed until the cell 11 reaching the first erasure state decreases, the application time of the first voltage applied to the cell 11 is set longer.

For example, as "n" and "k" are natural numbers, "n+k" represents the number of occurrences of performing step S1 until all of the cells 11 in the cell group 16 reaching the first erasure state. The application time of the first voltage applied to the part of the cells 11, which reaches the first erasure state with a number of occurrences "n" of performing step S1, is set longer in proportional to "k".

The easiness of data erasure varies even in one cell group 16. In a situation where the data erasure is performed for each of the cell groups 16, a variation may occur in the erasure state within a single cell group 16. On the other hand, the weak write is performed for the part of the cells 11, which reaches the first erasure state earlier than the other part of the cells 11. In other words, the weak write is performed for the cell 11 whose data is easily erased. Thus, the erasure states in the single cell group 16 can be aligned. Therefore, it may be possible to further shorten the write time.

Other Embodiments

The present disclosure is not limited to the above-described embodiments, and can be appropriately modified. Individual elements or features of a particular embodiment are not necessarily essential unless it is specifically stated that the elements or the features are essential in the foregoing description, or unless the elements or the features are obviously essential in principle. Further, in each of the embodiments described above, when numerical values such as the number, numerical value, quantity, range, and the like of the constituent elements of the embodiment are referred to, except in the case where the numerical values are expressly indispensable in particular, the case where the numerical values are obviously limited to a specific number in principle, and the like, the present disclosure is not limited to the specific number. Furthermore, when a shape, positional relationship, and the like of a constituent element or the like are mentioned in the embodiments described above, the shape, positional relationship, and the like are not limitations, unless it is expressly stated that the specific shape, positional relationship, and the like mentioned are essential and unless the specific shape, positional relationship, and the like mentioned are apparently limitations from a principle viewpoint.

For example, the determination in step S3 is performed for each of the cells 11, and the number of occurrences of performing step S1 may be varied for each of the cells 11 according to the respective erasure states of the multiple cells 11 in steps S1 to S3.

In step S4, among the multiple cells 11, it is possible to apply the second voltage only to the cells 11 to which step S1 is performed with a number of occurrences, which is larger than a predetermined number of occurrences, until reaching the first erasure state. In other words, it is possible to apply the second voltage only to the cells 11 whose data is not easily erased. In the experiment conducted by the present inventors, almost all the data in the cells 11 reaches the first erasure state by performing step S1 three times.

Further, an additional erasure may be applied with a longer time for the cell 11 whose data is not easily to be erased. In particular, when it is assumed that "x" represents the number of occurrences of performing step S1 until one of the multiple cells 11 reaching the first erasure state, step S4 may be applied such that the time t2 for the cell 11 is set to be longer as the "x" increases. For example, the time t2 may be increased in proportion to "x".

The invention claimed is:

1. A data erasure device for erasing data from a non-volatile semiconductor memory device having a plurality of cells in which data is written by an application of a first voltage and is erased by an application of a second voltage differing from the first voltage, the data erasure device comprising:
a controller configured to apply a voltage to the cells,
wherein the controller sets a magnitude of the second voltage to be constant,
wherein the controller applies the second voltage to the cells over a first time period with multiple occurrences to set the cells into a first erasure state,
wherein the controller applies the second voltage to the cells over a second time period to set the cells in a second erasure state, subsequent to that the controller sets the cells into the first erasure state, the second time period being longer than the first time period,
wherein the second erasure state is deeper than the first erasure state,
wherein, in a case where the controller sets the cells into the first erasure state, the controller changes a number of occurrences of applying the second voltage over the first time period to each of the cells or each of a plurality of cell groups having the cells according to respective erasure states of the cells,
wherein, subsequent to that the controller sets the cells into the first erasure state and prior to that the controller sets the cells into the second erasure state, the controller applies the first voltage to the cell which reaches the first erasure state earlier than other of the cells.

2. The data erasure device according to claim 1,
wherein, in the first erasure state, a value of a current, which flows through the cell in response to the controller applying a predetermined voltage to the cell, reaches a value within a predetermined range.

3. The data erasure device according to claim 1,
wherein, in a case where the controller sets the cells into the first erasure state, the controller repeats the application of the second voltage over the first time period until a value of a current, which flows through the cell in response to the controller applying a predetermined voltage to the cell, is smaller than or equal to a predetermined reference value.

4. The data erasure device according to claim 3,
wherein, in a case where the controller sets the cells into the first erasure state, the controller sets the first time period to leave at least one of the cells with the value of the current larger than the predetermined reference value, subsequent to the controller applying the second voltage over the first time period with one occurrence.

5. The data erasure device according to claim 1,
wherein, in a case where the controller sets the cells into the first erasure state, the controller applies the second voltage to each of the cell groups.

6. The data erasure device according to claim 5,
wherein a third time period represents a time required for setting all of the cells, which have been written with the data by the application of the first voltage, included in one of the cell groups into the first erasure state by the application of the second voltage with one occurrence, and
wherein, in a case where the controller sets the cells into the first erasure state, the controller sets the first time period to be shorter than the third time period, and applies the second voltage to the cells over the first time period.

7. The data erasure device according to claim 1,
wherein the controller lengthens a time of applying the first voltage to the cell, in response to a decrease in a number of occurrences of the controller applying the second voltage to the cell until the cell reaching the first erasure state.

8. A data erasure device for erasing data from a non-volatile semiconductor memory device having a plurality of cells in which data is written by an application of a first voltage and is erased by an application of a second voltage differing from the first voltage, the data erasure device comprising:
a controller configured to apply a voltage to the cells,
wherein the controller sets a magnitude of the second voltage to be constant,
wherein the controller applies the second voltage to the cells over a first time period with multiple occurrences to set the cells into a first erasure state,
wherein the controller applies the second voltage to the cells over a second time period to set the cells in a second erasure state, subsequent to that the controller sets the cells into the first erasure state, the second time period being longer than the first time period,
wherein the second erasure state is deeper than the first erasure state,
wherein, in a case where the controller sets the cells into the first erasure state, the controller changes a number of occurrences of applying the second voltage over the first time period to each of the cells or each of a plurality of cell groups having the cells according to respective erasure states of the cells,
wherein, in a case where the controller sets the cells into the second erasure state, the controller applies the second voltage to only a part of the cells which has a larger number of occurrences of the controller applying the second voltage until reaching the first erasure state, and
wherein the part of the cells has the larger number of occurrences than a predetermined number of occurrences.

9. The data erasure device according to claim 8,
wherein the predetermined number of occurrences is 3.

10. The data erasure device according to claim 1,
wherein a term x represents a number of occurrences of the controller applying the second voltage to one of the cells until the one of the cells reaching the first erasure state, and
wherein the controller lengthens the second time period for the one of the cells in response to an increase in the term x.

11. The data erasure device according to claim 1,
wherein the first time period is shorter than or equal to 1 millisecond.

12. The data erasure device according to claim 1,
wherein the cell includes
a gate insulation film arranged at a surface of a substrate and
a floating gate arranged on a surface of the gate insulation film, and
wherein the controller applies the second voltage to generate an electrical field, which is larger than or equal to 10 MV/cm and is smaller than or equal to 15 MV/cm, between the floating gate and the substrate, in a case where the controller sets the cells into the first erasure state.

13. The data erasure device according to claim 1,
wherein the second time period is longer than or equal to 10 milliseconds.

14. The data erasure device according to claim 1,
wherein the second time period has a time length at least 10 times longer than the first time period.

15. A method for manufacturing a non-volatile semiconductor memory device having a plurality of cells in which data is written by an application of a first voltage and is erased by an application of a second voltage, the method comprising:
checking of the cells,
wherein the checking of the cells includes:
setting of a magnitude of the second voltage to be constant;
applying of the second voltage to the cells over a first time period with multiple occurrences to set the cells into a first erasure state; and
applying of the second voltage to the cells over a second time period to set the cells in a second erasure state, subsequent to setting of the cells into the first erasure state,
wherein the second time period is longer than the first time period,
wherein the second erasure state is deeper than the first erasure state, and
wherein the setting of the cells into the first erasure state includes changing of a number of occurrences of applying the second voltage over the first time period to each of the cells or each of a plurality of cell groups having the cells according to respective erasure states of the cells; further comprising
applying of the first voltage to the cell, which reaches the first erasure state earlier than other of the cells, subsequent to the setting of the cells into the first erasure state.

16. The method according to claim 15,
wherein, in the first erasure state, a value of a current, which flows through the cell in response to applying of a predetermined voltage to the cell, reaches a value within a predetermined range.

17. The method according to claim 15,
wherein the setting of the cells into the first erasure state further includes repeating of the applying of the second voltage over the first time period until a value of a current, which flows through the cell in response to applying of a predetermined voltage to the cell, is smaller than or equal to a predetermined reference value.

18. The method according to claim 17,
wherein the setting of the cells into the first erasure state further includes setting of the first time period to leave at least one of the cells with the value of the current larger than the predetermined reference value, subsequent to the applying of the second voltage over the first time period with one occurrence.

19. The method according to claim 15,
wherein the setting of the cells into the first erasure state further includes the applying of the second voltage to each of the cell groups.

20. The method according to claim 19,
wherein the setting of the cells into the first erasure state further includes setting of the first time period to be shorter than a third time period to apply the second voltage to the cells over the first time period, and
wherein the third time period represents a time required for setting all of the cells, which have been written with the data by the application of the first voltage, included in one of the cell groups into the first erasure state by the applying of the second voltage with one occurrence.

21. The method according to claim 15,
wherein the applying of the first voltage includes lengthening of a time to apply the first voltage to the cell, in response to a decrease in a number of occurrences of applying the second voltage to the cell until the cell reaching the first erasure state.

22. A method for manufacturing a non-volatile semiconductor memory device having a plurality of cells in which data is written by an application of a first voltage and is erased by an application of a second voltage, the method comprising:
checking of the cells,
wherein the checking of the cells includes:
setting of a magnitude of the second voltage to be constant;
applying of the second voltage to the cells over a first time period with multiple occurrences to set the cells into a first erasure state; and
applying of the second voltage to the cells over a second time period to set the cells in a second erasure state, subsequent to setting of the cells into the first erasure state,
wherein the second time period is longer than the first time period,
wherein the second erasure state is deeper than the first erasure state, and
wherein the setting of the cells into the first erasure state includes changing of a number of occurrences of applying the second voltage over the first time period to each of the cells or each of a plurality of cell groups having the cells according to respective erasure states of the cells,
wherein the setting of the cells into the second erasure state includes the applying of the second voltage to only a part of the cells, which has a larger number of occurrences of the applying of the second voltage until reaching the first erasure state,
wherein the part of the cells has the larger number of occurrences than a predetermined number of occurrences.

23. The method according to claim 22,
wherein the predetermined number of occurrences is 3.

24. The method according to claim 15,
wherein a term x represents a number of occurrences of the applying of the second voltage to one of the cells until the one of the cells reaching the first erasure state in the setting of the cells into the first erasure state, and
wherein the setting of the cells into the second erasure state includes lengthening of the second time period for the one of the cells in response to an increase in the term x.

25. The method according to claim 15,
wherein the first time period is shorter than or equal to 1 millisecond.
26. The method according to claim 15,
wherein the cell includes a gate insulation film arranged at a surface of a substrate and a floating gate arranged on a surface of the gate insulation film, and
wherein the setting of the cells into the first erasure state further includes the applying of the second voltage to generate an electrical field, which is larger than or equal to 10 MV/cm and is smaller than or equal to 15 MV/cm, between the floating gate and the substrate.
27. The method according to claim 15,
wherein the second time period is longer than or equal to 10 milliseconds.
28. The method according to claim 15,
wherein the second time period has a time length at least 10 times longer than the first time period.

* * * * *